United States Patent [19]

Leary

[11] Patent Number: 5,357,397

[45] Date of Patent: Oct. 18, 1994

[54] ELECTRIC FIELD EMITTER DEVICE FOR ELECTROSTATIC DISCHARGE PROTECTION OF INTEGRATED CIRCUITS

[75] Inventor: David J. Leary, Ft. Collins, Colo.

[73] Assignee: Hewlett-Packard Company, Palo Alto, Calif.

[21] Appl. No.: 30,983

[22] Filed: Mar. 15, 1993

[51] Int. Cl.$^5$ .................................... H05K 1/18
[52] U.S. Cl. .................................. 361/220; 361/56; 361/91
[58] Field of Search ............... 361/212, 220, 56, 91

[56] References Cited

U.S. PATENT DOCUMENTS

| | | | |
|---|---|---|---|
| 3,676,742 | 7/1972 | Russell et al. | 317/33 R |
| 4,322,777 | 3/1982 | Ueta et al. | 361/397 |
| 4,617,605 | 10/1986 | Obrecht et al. | 361/220 |

OTHER PUBLICATIONS

Bock et al., "New Field-Emitter Switch for ESD Protection of Microwave Circuits", *Electronics Letters*, Sep. 10, 1992, vol. 28, No. 19, pp. 1822–1824.
Pancholy et al., "C-MOS/SOS Gate-Protection Networks", *IEEE Transactions on Electron Devices*, vol. ED-25, No. 8, Aug. 1978, pp. 917–925.
DeBar et al., "Spark Gap on Module to Protect MOS-LSI Chips", *IBM Technical Disclosure Bulletin*, vol. 19, No. 8, Jan. 1977, pp. 3110–3111.
Bock et al., "Microwave Devices by New Metallization Strategy", *EOS/ESD Symposium Proceedings*, 1990, pp. 193–195.
Linholm et al., "Electrostatic Gate Protection Using an Arc Gap Device", *Proceedings 11th IEEE Int'l. Rel. Phys. Symp.*, 1973, pp. 198–202.
Pancholy et al., "Gate Protection for CMOS/SOS*", *Proceedings 15th IEEE Int'l. Rel. Phys. Symp.*, 1977, pp. 132–137.
Hickernell et al, "Voltage Brkdown Characts. of Close Spaced Alum. Arc Gap Struct. on Oxidized Silicon", *Proceedings 15th IEEE Intl. Rel. Phys. Symp.*, 1977, pp. 198–202.
Holland et al., "A Study of Field Emission Microtriodes", *IEEE Transactions on Electron Devices*, vol. 38, No. 10, Oct. 1991.
Utsumi, "Keynote Address Vacuum Microelectronics: What's New and Exciting", *IEEE Transactions on Electron Devices*, vol. 38, No. 10, Oct. 1991.

*Primary Examiner*—A. D. Pellinen
*Assistant Examiner*—Sally C. Medley

[57] ABSTRACT

An electrostatic discharge device having a small separation between two traces wherein a voltage above a desired threshold will discharge across the separation through the mechanism of cold cathode electric field emission. Conditions which permit quantum mechanical tunneling of electrons across the emitting cathode/vacuum potential barrier, such as low emitter work function, electric field enhancing geometry, and cathode/anode separation size, determine the voltage necessary for discharge by this mechanism. One device has a first conductive trace formed on an insulating layer and then masked and etched to leave an undercut with a sharp point. A second conductive trace is formed in the undercut opposite the point, resulting in a three-dimensional cross section having a very small separation. A second device has the point formed by depositing a metal layer over a spacing in a dielectric layer, and then etching out the dielectric layer.

9 Claims, 3 Drawing Sheets

ELECTRIC FIELD EMITTER DEVICE FOR ELECTROSTATIC DISCHARGE PROTECTION OF INTEGRATED CIRCUITS

FIELD OF THE INVENTION

This invention relates to electronic circuits and more particularly to electronic integrated circuit devices. Even more particularly, the invention relates to protecting integrated circuit devices from damage caused by electrostatic discharge.

BACKGROUND OF THE INVENTION

Metal oxide semi-conductor (MOS) circuits, and particularly MOS integrated circuits are vulnerable to damage through electrostatic discharge (ESD). Damage results primarily from two mechanisms: charge injection and thermal degradation. Damage may manifest itself as failed circuits, margin shifts, or latent defects that continue to degrade, contributing to premature product failure. Eliminating ESD related defects requires on-chip protection structures as well as assembly and handling precaution measures. On-chip protection structures are often called input protection device (IPD) circuits, for example, input protection diodes are a type of prior art IPD circuit. Assembly and handling measures include transporting integrated circuits in conductive foam, conductive wrist straps for operators handling devices, and ionized air environments, as well as other measures.

There are three principle sources of charge that can result in damaging ESD events. The first source is human body discharge (HBD), wherein a charged person touches a device and discharges through the device to a ground, usually destroying the device. The second source is the device itself being charged and a discharge occurring when the device comes near a ground circuit. This type of discharge is faster and more severe than human body discharge. The third source is field induced charge wherein an external field induces a damaging or charging potential exceeding dielectric breakdown or creating trapped inversion charge.

Electrostatic voltage generation can result from triboelectric charging, caused by rapid separation of two materials—including gases or liquids flowing across a surface—which creates equal and opposite charges. Capacitive and inductive charging can also occur. Even in high humidity environments, voltages are still significant. Elevated humidity can reduce voltages below perceptible levels (approximately 3 KV) but not below damage thresholds, which can be as low as 30 volts.

The conventional approach to protecting MOS devices for ESD or electrical overstress voltages is to place p/n junction devices such as diodes and transistors in parallel with the input gate, such as illustrated in "Gate Protection for CMOS/SOS", R. Pancholy, in *Proceedings of the 15th IEEE International Rel. Physics Symposium*, pp. 132-137, 1977. This article also illustrates arc gap, also called spark gap, structures.

The ideal characteristics of an IPD network include limiting fast and slow rise time overvoltage events to below the dielectric breakdown voltage of the gate without degrading timing or logic operation. In today's electronics industry, ESD damage thresholds greater than 2000 volts are desired. High performance circuits require pad and IPD network designs that introduce negligible parasitic components, respond to the overvoltage transient faster than the damage mechanism of the gate dielectric, and require a minimum of layout area. Further, fabrication of the IPD network must be compatible with the integrated circuit fabrication technology being used, and the network must be stable in accelerated voltage/temperature quality screen environments, in radiation environments, and stable under repeated ESD/electrical overstress voltage events.

As referenced above, arc gap structures of planar parallel and saw-tooth geometry have been used in conjunction with p/n junction devices for input protection. These structures are not effective IPDs for high performance circuits because they rely on ionization discharge.

Ionization discharge requires a high electric field to strip electrons off atoms and molecules to form a conductive ionized plasma discharge path between cathode and anode conductors. The electric field must exceed the ionization potential of the intervening medium, and the spacing required to create the field is limited to dimensions determined by the photolighographic and design rule restrictions of the process. If the electric field is high enough, and the spacing small enough, a plasma is formed and electron discharge from the cathode occurs.

An arc event is usually destructive to the cathode and anode because of sputtering by ions in the plasma of the cathode, and vaporization of ions from both cathode and anode. Further, the process is relatively slow compared to the charge injection/trapping/breakdown mechanism of the thin gate dielectric. For this reason, arc gap IPDs use a series resistor and a parallel diode to slow the ESD rise time and provide a parallel path for current.

High performance circuits cannot tolerate the series resistance required for arc gap operation, and parasitic capacitance associated with p/n junction devices and their interconnection limits performance. Indeed, many high speed ICs make significant tradeoffs between pad performance and ESD protection, settling for less than 300 volt damage threshold with human body discharge to achieve timing and performance requirements.

Electrostatic discharge problems have plagued the electronics industry since MOS devices have been in use, with unprotected damage thresholds measured in the tens of volts, but handling and application requirements demanding protection to several thousand volts. There is need in the art then for a new type of input protection device to discharge high voltage from an input pad of an integrated circuit. There is a further need for such a device that provides improved response time, negligible parasitics, and high damage thresholds. There is a further need for such a device that can respond effectively to all three discharge sources.

SUMMARY OF THE INVENTION

It is an aspect of the present invention to provide a method and apparatus for discharging a high voltage from an input pad of an integrated circuit.

It is another aspect of the invention to discharge such high voltage through a discharge device having a small separation between two traces wherein a voltage above a threshold will cause electrons to pass across the separation to perform the discharge.

It is another aspect of the invention to provide a fabrication method of creating the discharge device.

The above and other aspects of the invention are accomplished by fabricating a discharge device, having a sharp point or edge, connected to a first trace, with a very small separation between the edge and a second trace, wherein a voltage above a desired threshold will cause electrons to pass across the separation and discharge to ground or through the power supply voltage using the mechanism of cold cathode electric field emission. The size of the separation, material, and geometry determines the emission characteristics and protection level.

The present invention identifies two ways of forming such traces and separation. A first device deposits a first metal layer on the substrate and then the layer is masked and etched. A second metal layer is placed over the first layer resulting in a three-dimensional cross section having a very small separation and wherein the first metal layer has a sharp point facing into the separation.

A second method for forming the device creates a channel within a first dielectric layer, and then deposits a second dielectric layer over the first dielectric layer and the channel. The second dielectric layer will contain a depression with a sharp valley at the point of the channel, with the depth of the valley determined by the width of the channel. A metal layer is then deposited over the second dielectric layer, and the metal will deposit in the valley. The second dielectric layer is then etched away, leaving the metal layer with a sharp point at the location of the valley.

In both of these devices, a soft vacuum is left at the separation point when a final passivation layer is deposited over the circuit. This soft vacuum aids in the electric field emission. A vacuum is not required, however, since the discharge occurs at voltages below the ionization threshold of most gases.

In addition to placing the input protection devices within an integrated circuit, these devices can also be placed in the package that contains the integrated circuit, or in a carrier of the package, or they can also be placed on a printed circuit board adjacent to the circuits.

BRIEF DESCRIPTION OF THE DRAWINGS

The above and other aspects, features, and advantages of the invention will be better understood by reading the following more particular description of the invention, presented in conjunction with the following drawings, wherein.

DESCRIPTION OF THE PREFERRED EMBODIMENT

The following description is of the best presently contemplated mode of carrying out the present invention. This description is not to be taken in a limiting sense but is made merely for the purpose of describing the general principles of the invention. The scope of the invention should be determined by referencing the appended claims.

In discharging an ESD event, electrons are injected across the emitter/vacuum potential barrier by the applied electric field, when the field is high enough to narrow the barrier sufficiently so that quantum mechanical tunneling occurs. This mechanism is referred to as cold cathode emission, in contrast to thermionic emission wherein electrons obtain the energy needed to surmount the emitter/vacuum barrier from joule heating of the emitter.

The emission current density from a cold cathode follows the well known Fowler-Nordheim field emission equation:

$$J = A_1 \frac{E^2}{\Phi_e} - \exp\left[-\frac{A_2 \Phi_e^{3/2}}{E}\right] \quad \{1\}$$

where $A_1$ and $A_2$ are field-dependent parameters, $\Phi$ is the emitter work function, and E is the electric field at the emitter surface given by the relationship $$E = \frac{\beta V}{d} \quad \{2\}$$

where V is the applied voltage, d is the cathode/anode spacing, and $\beta$ is the enhancement factor. $\beta = 1$ for parallel plate geometry and is greater than 1 when field enhancement occurs at a pointed tip.

Equation {1} indicates that emission current density, J, depends exponentially on the electric field at the emitter, E. Further, there is an exponential dependence of current density on work function as well. This relationship identifies the important parameters for efficient field emission structures generally, that is the shape of the emitter tip (or edge), emitter work function, and cathode/anode spacing. Equation {1} also indicates no dependence on temperature.

Figure 1:
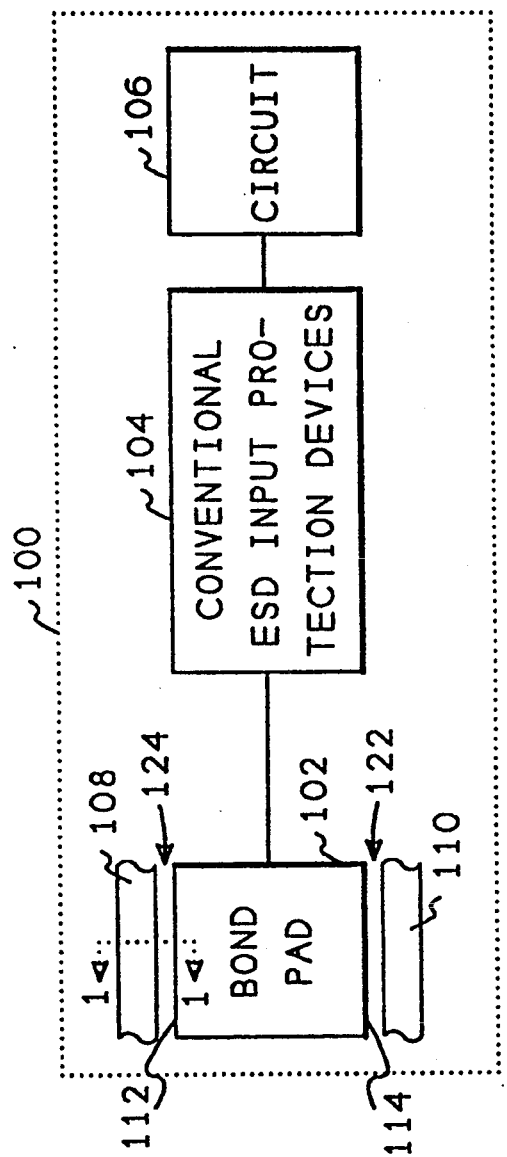
FIG. 1 shows the invention within its environment.

FIG. 1 shows a diagram of the invention in its environment. Referring now to FIG. 1, an integrated circuit 100 contains an electronic circuit 106 that receives signals from an external source (not shown) through an integrated circuit (IC) pad 102. Because the IC pad is a conductor connected outside the integrated circuit 100, it is subject to electrostatic discharge (ESD), and must be protected from this ESD. To protect the circuit 106 from the effects of ESD, electric field emitter devices of the present invention, comprising pad edges 112 and 114 along with trace pairs 108 and 110, are used to protect the circuit 106 from ESD.

The electric field emitter devices of the present invention comprise a pair of discharge devices, one connected to discharge ESD to circuit ground, and the other connected to discharge ESD to the power supply voltage. Trace 110 is connected between the pad 102 and circuit ground to discharge ESD to circuit ground. Trace 110 and pad 102 do not touch each other, but a small separation 122 is left between these traces to prevent normal circuit signals from being shunted to ground. The separation 122 is typically sub-micron in size, thus very low voltages, for example less than 10 volts, can be shunted through the separation 122 through the process of electric field emission. To aid this process, the edge 114 of pad 102 is constructed to have a pointed end leading into the separation 122. This pointed end creates an extremely small capacitance, much smaller than the capacitance of prior art input protection devices.

Trace 108 is connected between the IC pad 102 and the power supply voltage to discharge ESD to the power supply voltage. In a similar manner to trace 110, trace 108 and pad 102 do not touch each other, but a small separation 124, of sub-micro size, is left between these traces. Like pad edge 114, pad edge 112 has a pointed end that is pointed toward the separation 124 to aid the electric field emission process. The present invention can also be used in conjunction with conventional protection devices 104.

Figure 2:
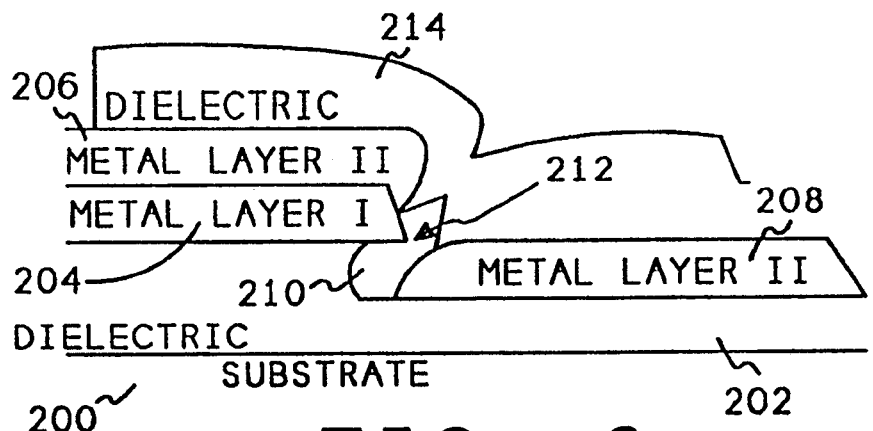
FIG. 2 shows a first embodiment of the device of the present invention that uses three dimensional construction.

FIG. 2 shows a first embodiment of the electric field emitter discharge device of the present invention. This embodiment is formed as a three dimensional structure on the integrated circuit, and a sharp point, or edge, is formed within the device. Referring now to FIG. 2, an oxide layer 202 is deposited on the silicon wafer substrate 200, to provide insulation. A first metal layer 204 is deposited on the oxide layer 202 to form a field enhancing tip or edge along the device's length. The first metal layer 204 is then etched to form a trace for discharging. The oxide layer 202 is then selectively etched to undercut the first metal layer 204, and leave a sharp point 212 on the end of the first metal layer 204. This sharp point 212 could also be formed as several points or an edge to enhance current discharge capacity. A second metal layer, which is not conformally covered, is deposited on the device resulting in traces 206 and 208 and the separation area 210. This depositing will form a curved surface on the trace 208 near the point 212. The separation between the point 212, located on the first metal layer 204 and the trace 208 of the second metal layer provides the discharge path.

Lastly, a conformal dielectric or passivation layer 214 is created by directional deposition (sputtering) of a sufficient thickness that during deposition the solid front of the growing film merges, pinching off and sealing the separation area 210 that contains the emitter tip cathode and anode. If the integrated circuit is being created in a vacuum, the separation area 210 will be sealed by the passivation layer, leaving a soft vacuum through which the discharge occurs. The void is sealed during deposition which for silicon oxide and silicon nitride CVD processes occurs in the 0.1 to 1.0 Torr pressure range. The void will contain some unreacted source gases such as silane and ammonia or nitrous oxide, and gaseous reaction products, primarily hydrogen. While a soft vacuum may enhance the discharge, it is not required, since the discharge voltage will be below the ionization voltage of any gas left in the separation area 210, thus preventing arcing.

Placing the structure along the length of the bond pad accomplishes an efficient physical layout with minimal demands on available area, as well as accomplishing immediate proximity of the IPD to the input source of the overvoltage. However, those skilled in the art will recognize that the device could be formed in a trace connected to the pad, but at some distance from the pad.

This method of creating the separation between the traces of the electric field emitter device results in a separation smaller than can be achieved by the etching processes. Because of the curved surface on the trace 208, the separation between the trace 208 and the point 212 of trace 204 will be smaller than any separation formed by etching. In this manner, sub-micron separations can be formed.

The structure of FIG. 2 can be fabricated with many combinations of materials compatible with IC manufacturing including silicon, gallium arsenide, tungsten, aluminum, and tantalum. Low work function materials such as gold or platinum may be used for the emitter. Gases which enhance emission by lowering the work function such as hydrogen may be used to optimize performance. A superconducting material could also be used as the metal layer 204.

Because of the ease of fabrication, low parasitic capacitance and no series resistance, arrays of such devices could be incorporated into the package that carries the IC, or incorporated into the carrier into which the package might be inserted, and into the printed circuit board to shunt possible on-board electrostatic charge collecting antennas.

Figure 3:
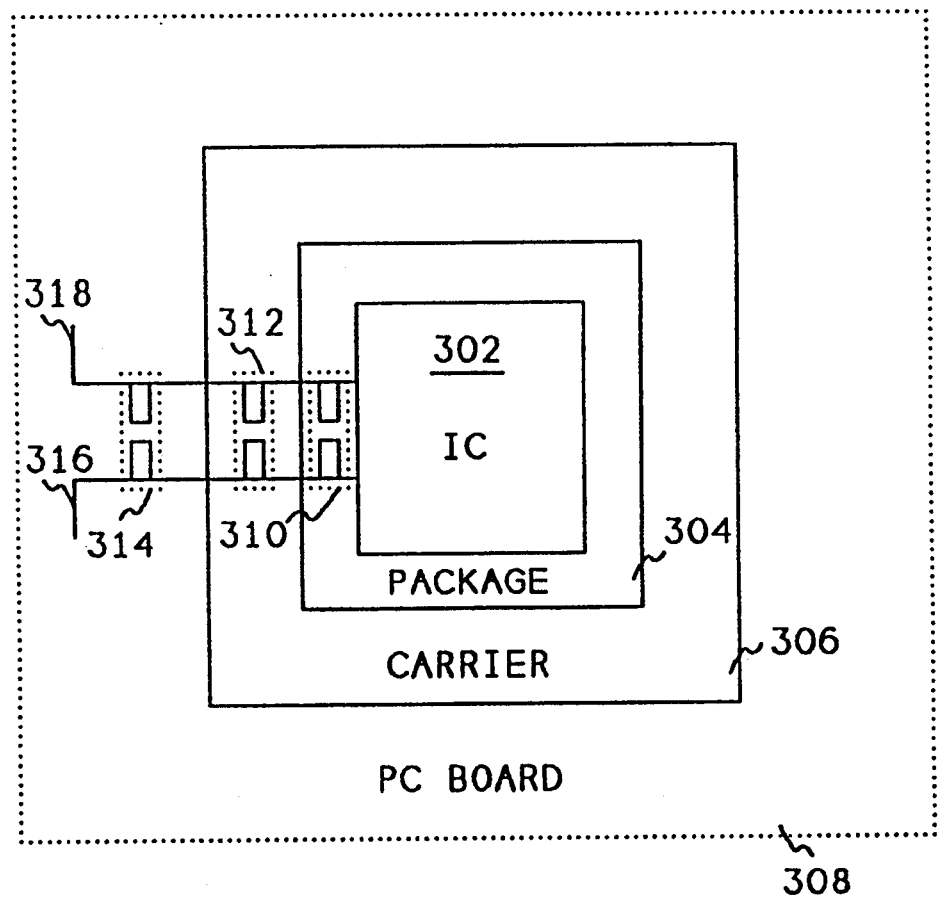
FIG. 3 shows the device of the present invention being used in an integrated circuit package, an integrated circuit carrier, and a printed circuit board.

FIG. 3 shows the electric field emitter device in use at several different locations within an electronic device. Referring now to FIG. 3, an integrated circuit 302 may contain the electric field emitter device 310 of the present invention to discharge each signal trace, such as signal traces 316 and 318, connected to the integrated circuit 302. In addition, an electric field emitter device 312 can be placed within an integrated circuit chip carrier 306 to discharge damaging signals before they reach the integrated circuit 302. Electric field emitter device 314 may also be built onto a printed circuit board 308 to provide additional protection.

In practice all these devices might not be used for a single integrated circuit, but FIG. 3 shows that the devices may be placed within an integrated circuit, within a chip carrier, or on an printed circuit board containing the integrated circuit, or any combination of these locations.

Figure 4:
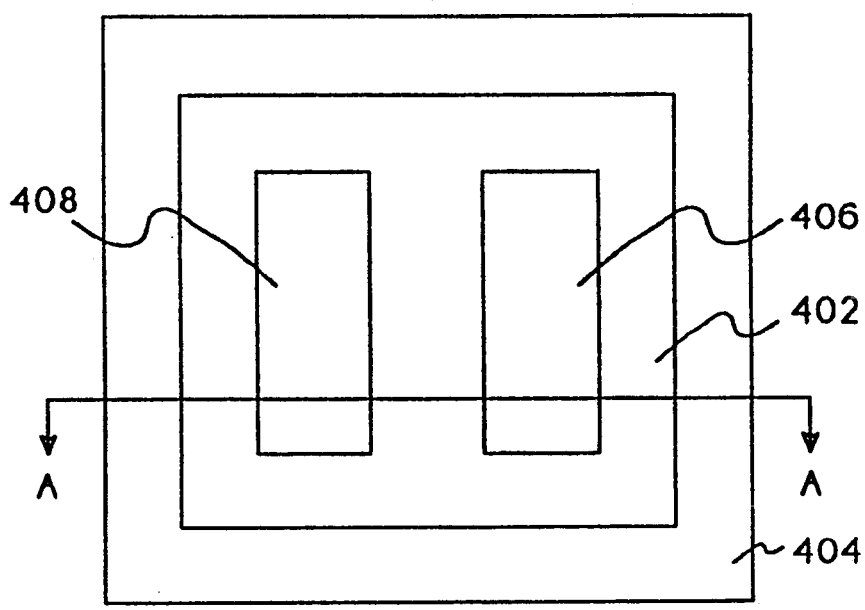
FIG. 4 shows a second embodiment of the present invention and illustrates a second method of forming a discharge point.
Figure 5:
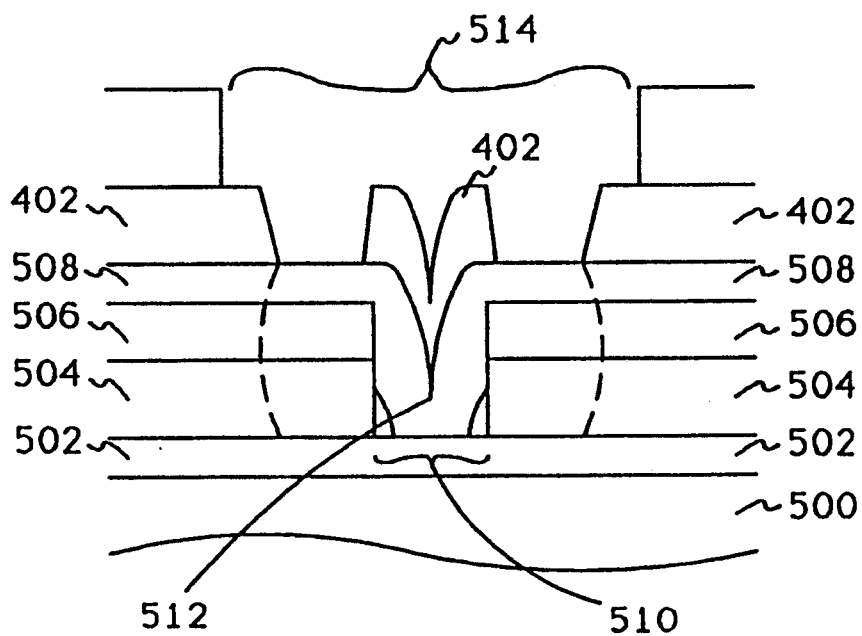
FIG. 5 shows a cutaway view of the device of FIG. 4 taken through the line A—A.

FIGS. 4 and 5 show a second embodiment of the device of the present invention, wherein FIG. 4 is a top view, and FIG. 5 is a cutaway view taken through the line A—A of FIG. 4. Referring now to FIGS. 4 and 5, a substrate 500 has a conductive layer 504 deposited thereon, and a dielectric layer 504 patterned to leave a spacing 510. A dielectric layer 506 is deposited on the dielectric layer 504, and the spacing 510 is also present in the dielectric layer 506. A dielectric layer 508 is deposited over the two dielectric layers 504 and 506, and also over the spacing 510. Depositing the dielectric layer 508 over the spacing 510 will cause a valley 512 to form. A metal layer 402 is deposited over the dielectric layer 508, and subsequently patterned and etched, leaving two openings 406 and 408. The dielectric layer 508 is then etched, which will etch the dielectric below the valley 512 within the spacing 510, leaving a sharp point of the metal layer 402 at the location of the valley 512. Lastly, a passivation layer 404 is deposited over the entire circuit, which seals the area of the spacing 510 under the valley 512 and creating a soft vacuum. In FIGS. 4 and 5, an opening 514 has been left in the passivation layer 404 so that the top view, FIG. 4, can show the metal layer 402, however, in practice, the opening 514 would not be present.

Discharge would occur between the tip of the emitting cathode 402, which is formed in the valley 512, and the collecting anode 502. The separation between the emitting cathode 402 and the collecting anode 502 can be controlled by the width of the spacing 510. As the spacing 510 is made wider, the valley 512 will be closer to the collecting anode 502.

Having thus described a presently preferred embodiment of the present invention, it will now be appreciated that the aspects of the invention have been fully achieved, and it will be understood by those skilled in the art that many changes in construction and circuitry and widely differing embodiments and applications of the invention will suggest themselves without departing from the spirit and scope of the present invention. The disclosures and the description herein are intended to be illustrative and are not in any sense limiting of the invention, more preferably defined in scope by the following claims.

What is claimed is:

1. A device for protecting circuits from electrostatic discharge, said device comprising:
   a first trace connected to an input circuit path to be protected from electrostatic discharge, wherein said first trace is formed with a point thereon;
   a second trace connected to a discharge path; wherein said discharge path comprises a connection to either a circuit ground or a circuit supply voltage, and further wherein said second trace is formed having a convex surface with a convex side facing said first trace; and
   a separation between said first trace and said second trace, wherein said first and second traces are constructed so that a minimal distance between said traces occurs between said point and said second trace.

2. The device of claim 1 further comprising a passivation layer formed over said first and second traces, wherein said passivation layer seals said separation to create a vacuum therein.

3. The device of claim 2 wherein said vacuum is a soft vacuum having a pressure range between 0.1 Torr and 1.0 Torr.

4. A device for protecting circuits from electrostatic discharge, said device comprising:
   a first trace connected to an input circuit path to be protected from electrostatic discharge, wherein said first trace is formed having an edge located thereon;
   a second trace connected to a discharge path, wherein said discharge path comprises a connection to either a circuit ground or a circuit supply voltage, and further wherein said second trace is formed having a convex surface with a convex side facing said first trace; and
   a separation between said first trace and said second trace, wherein said first and second traces are constructed such that a minimal distance between said traces occurs between said edge and said second trace.

5. The device of claim 4 further comprising a passivation layer formed over said first and second traces, wherein said passivation layer seals said separation to create a vacuum therein.

6. The device of claim 5 wherein said vacuum is a soft vacuum having a pressure range between 0.1 Torr and 1.0 Torr.

7. A device for protecting circuits from electrostatic discharge, said device comprising:
   a connecting pad for connecting an input circuit path to an external circuit, said connecting pad having an edge located thereon;
   a trace formed adjacent said connecting pad, and connected to a discharge path, wherein said discharge path comprises a connection to either a ground connecting pad or a supply voltage connecting pad, and further wherein said trace is formed having a convex surface with a convex side facing said connecting pad; and
   a separation between said connecting pad and said trace, wherein said connecting pad and trace are constructed such that a minimal distance between said connecting pad and said trace occurs between said edge and said trace.

8. The device of claim 7 further comprising a passivation layer formed over said edge of said connecting pad and said trace, wherein said passivation layer seals said separation to create a vacuum therein.

9. The device of claim 8 wherein said vacuum is a soft vacuum having a pressure range between 0.1 Torr and 1.0 Torr.

* * * * *